(12) United States Patent
Davies, Jr.

(10) Patent No.: US 7,016,219 B1
(45) Date of Patent: Mar. 21, 2006

(54) SINGLE TRANSISTOR NON-VOLATILE MEMORY SYSTEM, DESIGN, AND OPERATION

(75) Inventor: Thomas J. Davies, Jr., Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 76 days.

(21) Appl. No.: 10/737,616

(22) Filed: Dec. 16, 2003

(51) Int. Cl.
*G11C 11/24* (2006.01)

(52) U.S. Cl. .................. 365/149; 365/185.01
(58) Field of Classification Search ................ 365/149, 365/189.04, 185.24
See application file for complete search history.

(56) References Cited

U.S. PATENT DOCUMENTS

| | | | |
|---|---|---|---|
| 5,126,969 A | * | 6/1992 | Kawana .................. 365/185.08 |
| 5,880,988 A | * | 3/1999 | Bertin et al. .................. 365/63 |
| 6,314,017 B1 | * | 11/2001 | Emori et al. ................. 365/149 |

\* cited by examiner

*Primary Examiner*—Thong Q. Le
(74) *Attorney, Agent, or Firm*—Arthur Joseph Behiel; Kim Kanzaki

(57) ABSTRACT

Described are area-efficient non-volatile memory systems. Non-volatile memory cells in these systems include only one transistor, two fewer than conventional non-volatile memory cells, and reduced interconnect. The simplicity of the memory cells reduces memory-system area, improves manufacturing yield, and consequently reduces cost. New program, erase, and read methodologies have been developed for use with the simplified memory cells.

17 Claims, 8 Drawing Sheets

SINGLE TRANSISTOR NON-VOLATILE MEMORY SYSTEM, DESIGN, AND OPERATION

FIELD OF INVENTION

The present invention relates in general to memory circuits.

BACKGROUND

Programmable logic devices (PLDs) are a well-known class of digital integrated circuits that may be programmed by a user (e.g., a circuit designer) to perform specified logic functions. Complex PLDs typically include an array of configurable logic elements that are programmably interconnected to each other and to programmable input/output blocks via some form of programmable interconnect. This collection of configurable logic may be customized by loading configuration data into internal configuration memory cells that define how the logic elements, interconnect, and input/output blocks are configured.

FIG. 1 (prior art) is a block diagram depicting one form of complex PLD (CPLD) 100, which includes configurable logic and interconnect 105, configurable input/output blocks 110, input/output pins 115, and an array of non-volatile memory 120. CPLD 100 is personalized by loading non-volatile memory 120 with configuration data. CPLD 100 then transfers the contents of memory 120 into static random-access memory cells (not shown) within configurable logic and interconnect 105 and input/output blocks 110 when CPLD 100 is powered up.

FIG. 2 (prior art) depicts a non-volatile memory array 200 typical of the type employed in non-volatile memory 120 of FIG. 1. Memory array 200 includes rows [r] and columns [c] of identical three-transistor (3T) EEPROM memory cells 205[r,c], wordlines wL[r] and control-gate lines cgL[r] connected to the rows of memory cells 205, and read bitlines rBL[c] and configuration bitlines CBL[c] connected the columns of memory cells. Memory array 200 additionally includes a virtual ground terminal VGND connected to each memory cell 205[r,c].

Each memory cell 205[r,c] includes an access transistor 210, a configuration transistor 215, a memory transistor 220, a programming dielectric 225, and a capacitor 230. Memory cells 205[r,c] can be programmed or erased by moving charge to and from the floating-gate node FG through programming dielectric 225, typically a so-called "tunnel oxide," to change the threshold voltage of transistor 220. The following discussion focuses on memory cell 205[0,0]: the remaining memory cells are identical.

Memory cell 205[0,0] is read by forward biasing access transistor 210 using wordline wL0 and applying a read voltage, typically supply voltage VDD, to control-gate line cgL0. If the threshold voltage of transistor 220 is low (i.e., cell 205[0,0] is programmed), transistor 220 will conduct (i.e., provide a low impedance), connecting read bitline rBL0 to ground potential via access transistor 210. A sense amplifier (not shown) connected to read bitline rBL0 produces an output voltage representative of a first stored logic level, typically a logic zero. If, on the other hand, the threshold voltage of transistor 220 is high (i.e., cell 205[0,0] is erased), transistor 220 will not conduct (i.e., provide a high impedance) with supply voltage VDD applied to control-gate line cgL0, so read bitline rBL0 will remain isolated from ground potential. The sense amplifier connected to read bitline rBL0 thus produces an output voltage representative of a second stored logic level, typically a logic one.

To erase memory cell 205[0,0], ground potential is applied to configuration bitline cBL0 and a programming voltage VPP greater than supply voltage VDD is applied to electrons to floating gate node FG through oxide 225, raising the threshold voltage of transistor 220. To program memory cell 205[0,0], ground potential is applied to control-gate line cgL0 and programming voltage VPP is applied to wordline wL0 and configuration bitline cBL0. This biasing arrangement moves electrons away from floating gate node FG through oxide 225, reducing the threshold voltage of transistor 220.

Memory array 200 reliably stores configuration data, and CPLDs have proven valuable for many applications. Unfortunately, the non-volatile memory can occupy about 20% or more of the area of a CPLD. Because area is key factor in the cost of manufacturing integrated circuits, the inclusion of non-volatile memory considerably increases the expense of producing CPLDs and other circuits that employ non-volatile memory. There is therefore a need for more area-efficient non-volatile memory.

SUMMARY

The present invention is directed to area-efficient non-volatile memory systems. These systems employ memory cells with fewer transistors and interconnections than memory cells of conventional systems. This reduction in the required number of components reduces memory area, improves manufacturing yield, and consequently reduces the production cost of non-volatile memory. New program, erase, and read methodologies have been developed for use with the new memory systems.

This summary does not limit the invention, which is instead defined by the claims.

DETAILED DESCRIPTION

Figure 3:
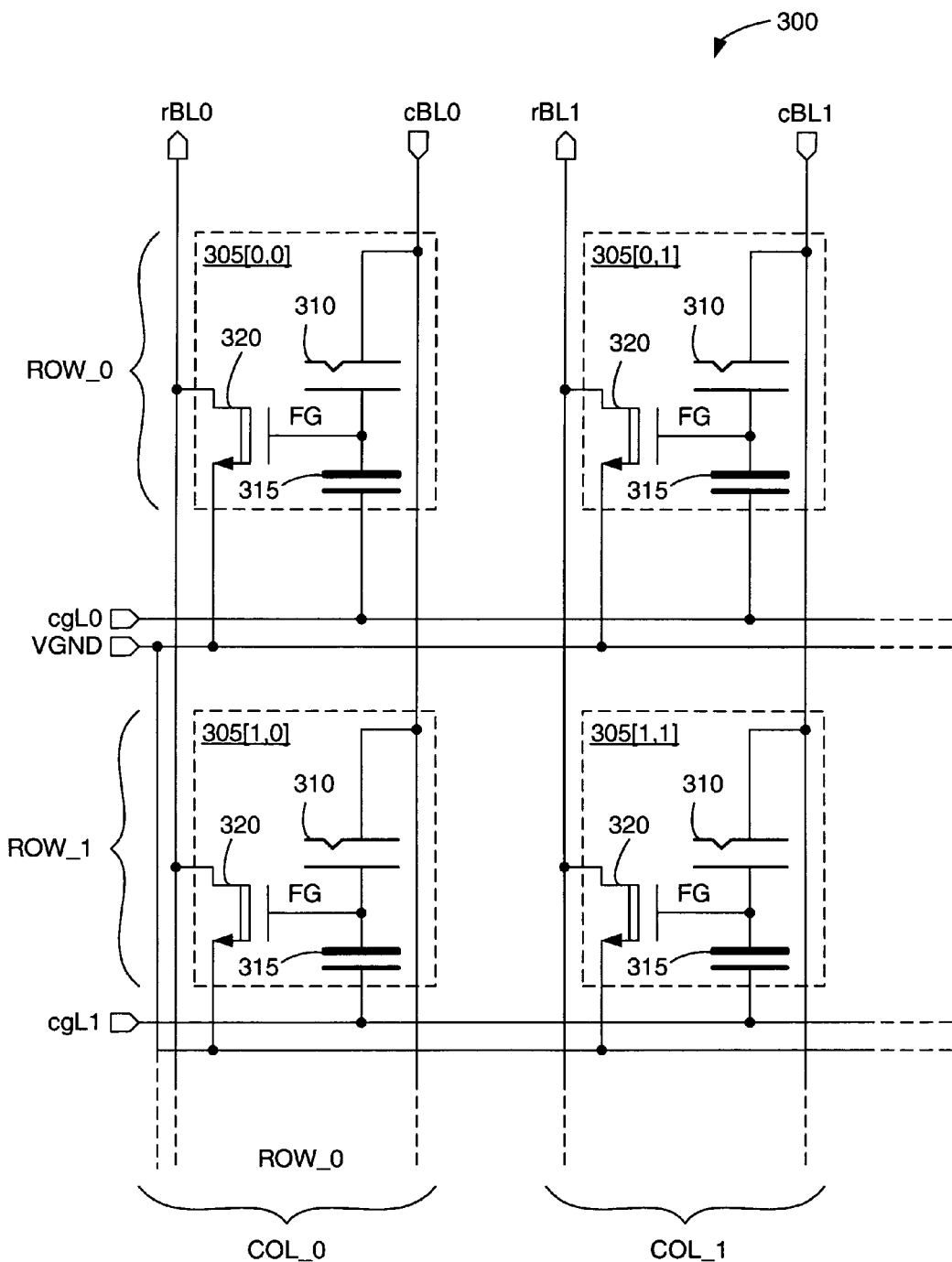
FIG. 3 depicts an area-efficient non-volatile memory system 300 in accordance with one embodiment.

FIG. 3 depicts an area-efficient non-volatile memory system 300 in accordance with one embodiment. New approaches to accessing memory system 300 facilitate removal of the access transistors, configuration transistors, and wordlines of conventional EEPROM cells. This reduction in the required number of components reduces memory area, improves manufacturing yield, and consequently reduces the cost of non-volatile memory.

Figure 1:
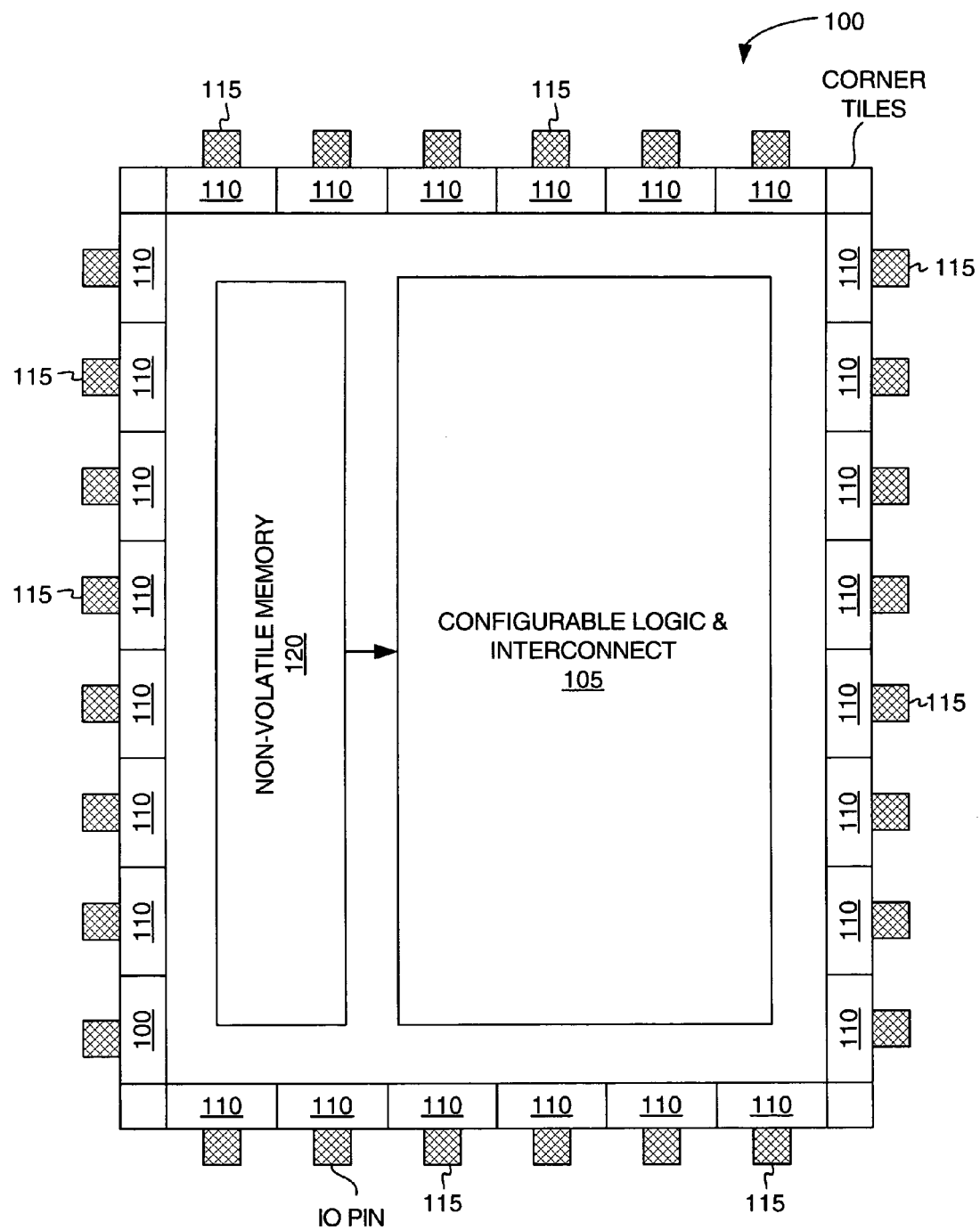
FIG. 1 (prior art) is a block diagram depicting one form of complex PLD (CPLD) 100.
Figure 2:
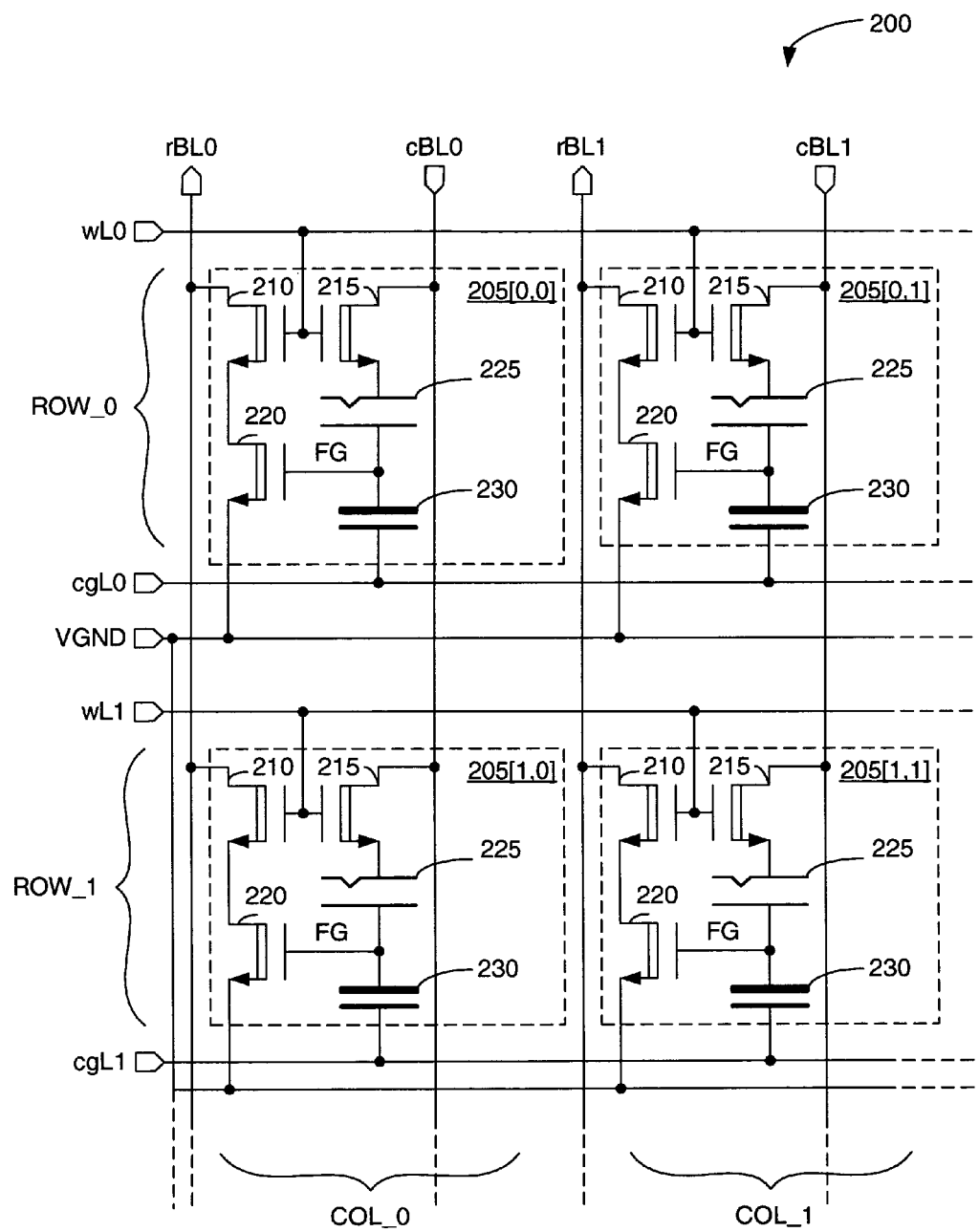
FIG. 2 (prior art) depicts a non-volatile memory array 200 typical of the type employed in non-volatile memory

Memory system 300 includes an array of r rows and c columns of memory cells 305[r,c]. Each memory cell includes a tunnel oxide 310, a capacitor 315, and a memory transistor 320. Each memory cell 305[r,c] lacks an access transistor like transistor 210 of FIG. 2, so the read bitline rBL[c] associated with each column of memory cells connects directly include intervening transistors). Each memory cell 305[r,c] also lacks a configuration transistor like transistor 215 of FIG. 2, so the configuration bitline cBL[c] associated with each column connects directly to tunnel oxides 310. In each row of memory cells 305[r,c], a control-gate line cgL[r] interconnects capacitors 315 and a virtual-ground line VGND interconnects the sources of transistors 320.

When memory system 300 is first fabricated, each memory transistor 320 has an indeterminate threshold voltage level that can be altered to a determinate threshold voltage level by transferring electrons to or from a floating-gate node FG common to tunnel oxide 310, capacitor 315, and transistor 320. In the embodiments described herein, memory cells are erased by injecting electrons to floating gate node FG to raise the threshold voltage of transistor 320 to a determinate erase threshold voltage $V_{THE}$ greater than a read voltage $V_{RD}$, and are programmed by removing electrons from floating gate node FG to lower the threshold voltage of transistor 320 to a determinate program threshold voltage $V_{THP}$ less than read voltage $V_{RD}$. Equation 1 below expresses the relationship between the read voltage and the erase and program threshold voltages.

$$V_{THE} > V_{RD} > V_{THP} \quad (1)$$

A memory transistor 320 having program threshold voltage $V_{THP}$ is said to be programmed, and is biased on (i.e., exhibits a relatively low source-drain resistance) with read voltage $V_{RD}$ applied to floating gate FG. A memory transistor 320 having erase threshold voltage $V_{THE}$ is said to be erased, and is biased off (i.e., exhibits a relatively high source-drain resistance) with the same read voltage $V_{RD}$ applied to floating gate FG. Memory cells 305[r,c] can therefore be read by applying read voltage $V_{RD}$ (typically supply voltage VDD) to the corresponding control-gate line cgL [r] and determining whether the memory transistor 320 is in a conductive state or a non-conductive state (i.e., is conductive or non-conductive in response to the applied control-gate voltage). To read memory cell 305[0,0], for example, read bitline rBL0 is precharged to VDD and then VDD is applied to control-gate line cgL0. If transistor 320 within memory cell 305[0,0] is conductive, read bitline rBL0 is pulled toward ground, a voltage level representative of a logic zero; if transistor 320 is not conductive, read bitline rBL0 will remain at the precharged voltage level representative of a logic one.

Figure 4:
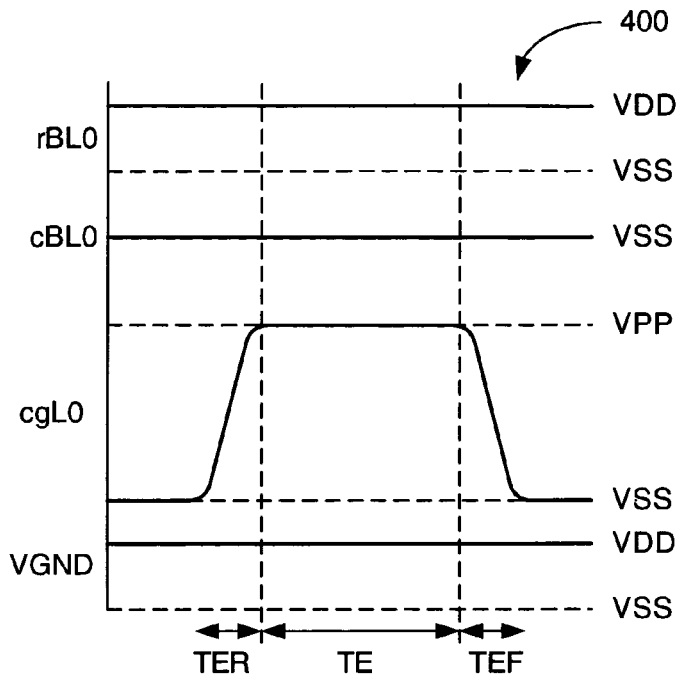
FIG. 4 is a graph 400 of the voltage levels used to erase memory cell 305[0,0], an exemplary memory cell in the array of memory system 300.

FIGS. 4–9 and related text describe the operation of an embodiment of memory system 300 of FIG. 3. FIG. 4 is a graph 400 of the voltage levels used to erase memory cell 305[0,0], an exemplary memory cell in the array of memory system 300. Labels on the left y-axis of graph 400 correspond to like-named terminals of memory system 300, while labels on the right y-axis of graph 400 indicate voltage levels of the respective signals.

The example assumes a convention in which a first voltage level VSS is representative of a logic zero and a second voltage level VDD (the supply voltage) is representative of a logic one. A third voltage level VPP greater than VDD is used to program and erase memory cells 305[r,c]. Continuous lines represent applied voltage levels. For example, signal cgL0 ranges between voltage levels VSS and VPP. (As with other designations herein, cgL0 refers both to a node and its corresponding signal; whether a given designation refers to a signal or a node will be clear from the context.) In one embodiment, supply voltage VDD is 1.8 volts, voltage VPP is 14.5 volts, and VSS is ground potential, or zero volts.

FIG. 4 is a graph 400 of the voltage levels used to erase memory cell 305[0,0]. To erase memory cell read bitline rBL0 and virtual ground terminal VGND, voltage VSS (ground potential in this example) is applied to the corresponding configuration bitline cBL0, and configuration voltage VPP is applied to the corresponding control-gate line cgL0. Signal cgL0 is ramped up from level VSS to level VPP during erase-ramp period TER, maintained at level VPP during erase period TE, and ramped back down to VSS during period TEF. Erase period TE, about 100 milliseconds in one embodiment, is an empirically determined time sufficient for configuration voltage VPP to induce a change in the threshold voltage of memory cells 305[r,c] to an erase threshold voltage $V_{THE}$ by injecting electrons to floating gate node FG. The remaining memory cells 305[r,c] are erased in the same manner, typically all at once or in groups of one or more rows.

Figure 5:
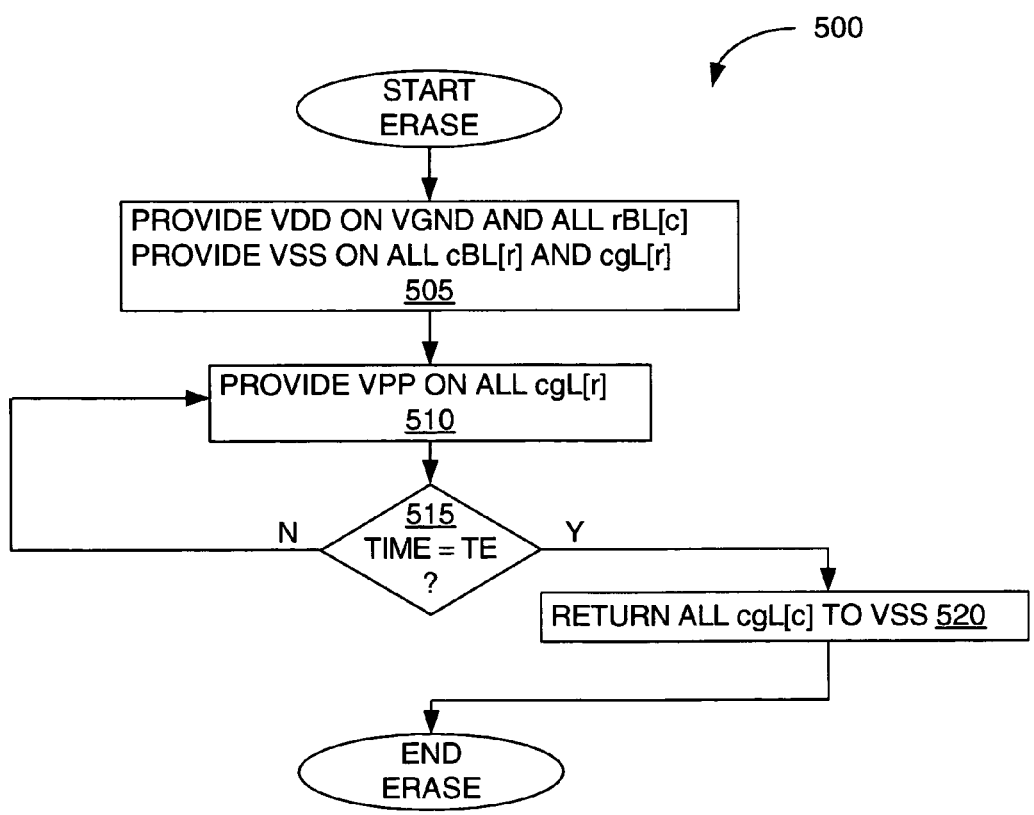
FIG. 5 is a flowchart 500 showing a method of simultaneously erasing each memory cell 305 [r,c] of memory system 300.

FIG. 5 is a flowchart 500 showing a method of simultaneously erasing each memory cell 305[r,c] of memory system 300. Starting at step 505, virtual ground terminal VGND and all read bitlines rBL[c] receive supply voltage VDD, and configuration bitlines cBL[c] and control-gate lines cgL[r] receive voltage level VSS. Next (step 510), voltage level VPP is applied to control gate lines cgL[r] of selected rows. After the passing of erase period TE (decision 515), control-gate lines cgL[r] are returned to VSS (step 520). In this erase process, the simultaneous application of voltage level VSS to configuration bitlines cBL[c] and configuration voltage VPP to control gate lines cgL[r] creates a sufficient electric field across tunnel oxide 310 to inject electrons into floating gate FG.

Figure 6:
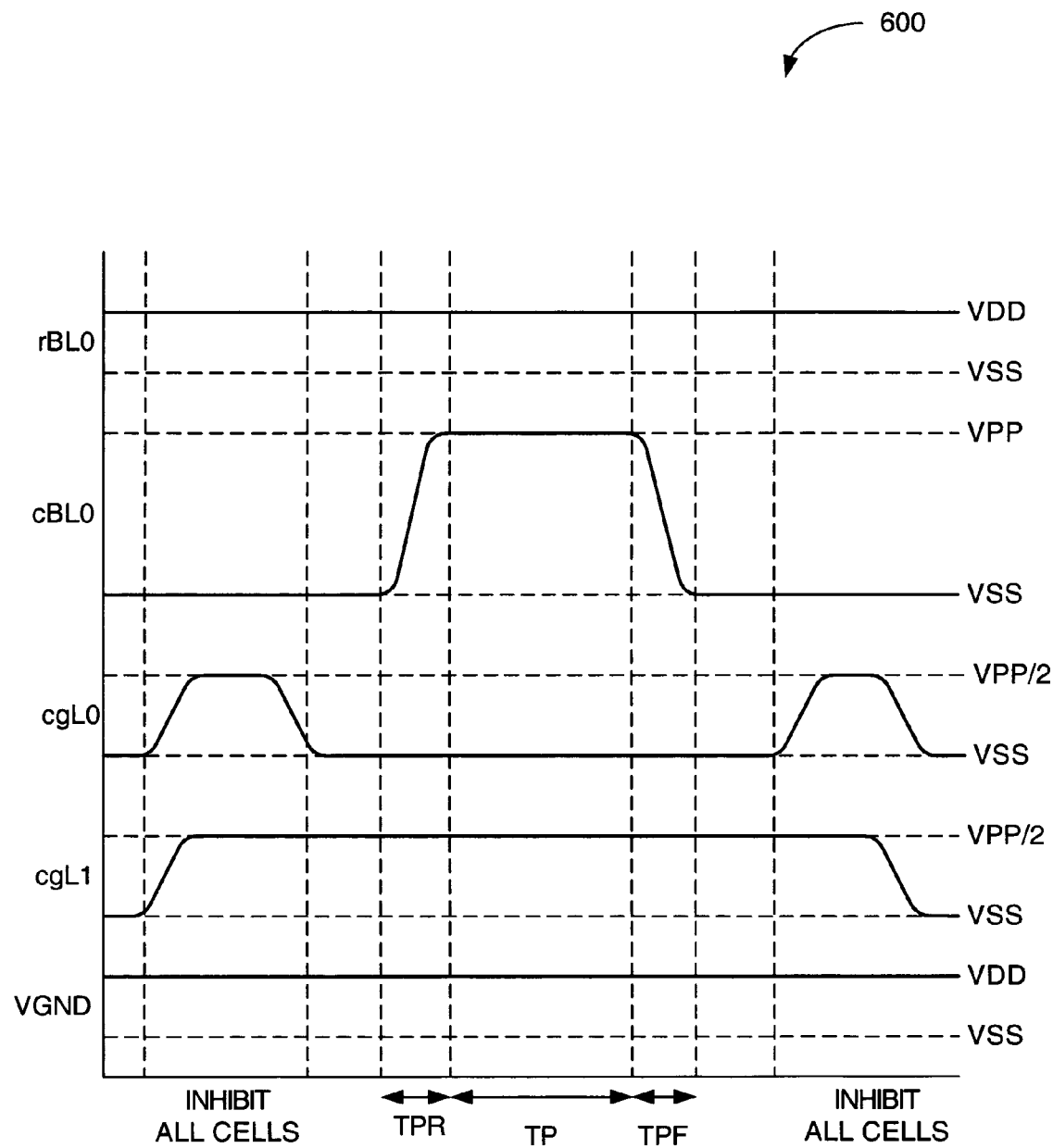
FIG. 6 is a graph 600 of the voltage levels used to program memory cell 305[0,0] of FIG. 3.

FIG. 6 is a graph 600 of the voltage levels used to program memory cell 305[0,0] of FIG. 3. Graph 600 is similar to graph 400 of FIG. 4; unlike graph 400, however, graph 600 depicts a program-inhibit voltage between programming voltages VPP and VSS, half configuration voltage cells are erased before they are programmed, so programming a given memory cell adjusts the threshold voltage from erase threshold voltage $V_{THE}$ to program threshold voltage $V_{THP}$. In this example, a programmed cell represents a logic zero and an erased cell represents a logic one, though the reverse convention might also be used.

Prior to programming memory cell 305[0,0], supply voltage VDD is applied both to read bitline rBL0 and virtual ground terminal VGND. The programming sequence is initiated when voltage VPP/2 is applied to all control-gate lines cgL[r] of memory system 300, lines cgL0 and cgL1 in this example.

Memory cell 305[0,0] is programmed by pulling line cgL0 to VSS and bitline cBL0 to a programming voltage VPP. Signal cbL0 is ramped up from level VSS to level VPP during program-ramp period TPR, maintained at level VPP during a program period TP, and ramped back down to level VSS during a program-fall period TPF. The control-gate lines associated with unselected cells are maintained at voltage VPP/2 during periods TPR, TP, and TPF to prevent the programming of unselected memory cells. In this example, control-gate line cgL1 is held at VPP/2 to prevent memory cell 305[1,0] from being programmed in response to the programming voltage VPP being applied to configuration bitline cBL0. Program time TP, about 10 milliseconds in one embodiment, is an empirically determined time sufficient for configuration voltage VPP to change the threshold voltage of erased memory cells $V_{THE}$ to a program threshold voltage $V_{THP}$. If applied to quickly, the programming voltage VPP can break down oxide 310. The program-ramp period TPR prevents this problem, and is between one and two hundred microseconds in one embodiment.

Figure 7:
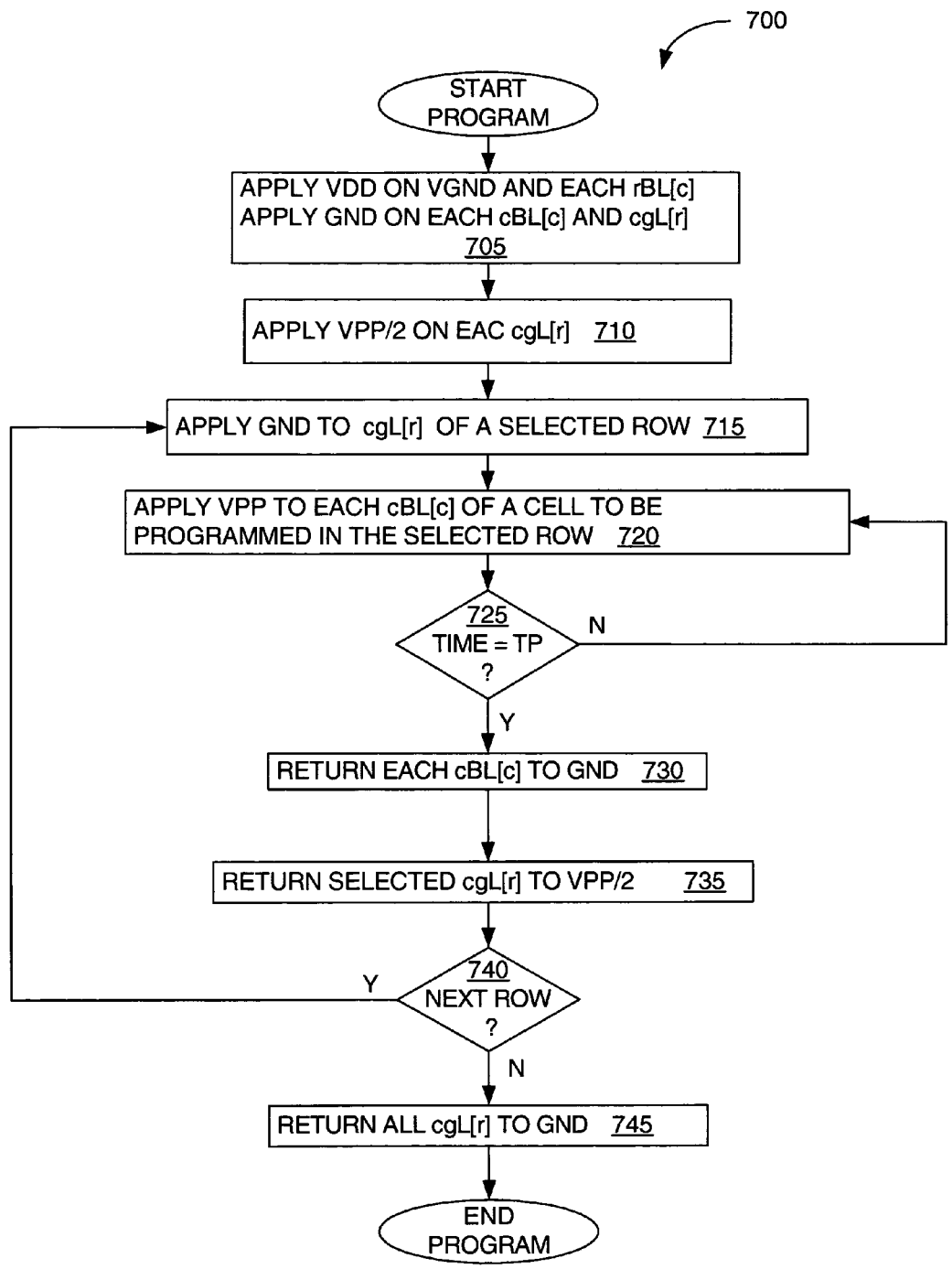
FIG. 7 is a flowchart 700 outlining a method of programming memory cells 305 in accordance with some embodiments.

FIG. 7 is a flowchart 700 outlining a method of programming memory cells 305 in accordance with some embodiments. The following discussion assumes memory cells 305[r,c] are erased, in the manner discussed above, prior to programming. Starting at step 705, supply voltage VDD is applied to virtual ground terminal VGND and all read bitlines rBL[c]. Each configuration bitline cBL[c] receives a respective version of a first configuration signal transmitting ground voltage GND, and each control-gate line cgL[r] receives a respective version of a second configuration signal transmitting ground voltage GND. At step 710, half-configuration voltage VPP/2 is applied to each control-gate line cgL[r]. Next, at step 715, a row is selected for programming by replacing the half-configuration voltage VPP/2 on line cgL[r] of the selected row with ground potential. The program-inhibit voltage VPP/2 on the control gate lines of the unselected rows inhibits programming of unselected memory cells.

In step 720, programming voltage VPP is applied to the configuration bitlines cBL[c] of those memory cells to be programmed in the selected row. Decision 725 monitors the duration of the applied programming voltage VPP: when the elapsed time is equal to programming time TP, the programming voltage VPP applied to selected bitlines cBL[c] returns to ground voltage GND (step 730). The version of the second configuration signal on control-gate line cgL[r] of the selected row of memory cells then returns to half configuration voltage VPP/2 (step 735). The next row of memory cells, if any, is then selected and steps 715 to 740 are repeated (decision 740). Once all rows are programmed, all control-gate lines cgL[r] are returned to ground potential (step 745).

Figure 8:
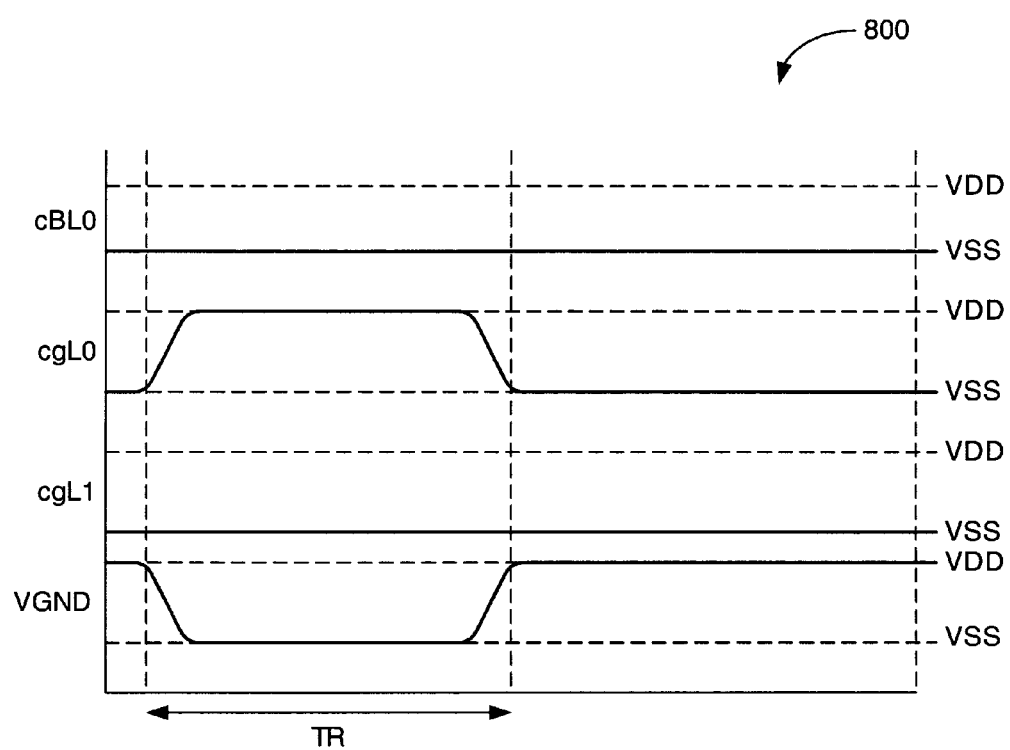
FIG. 8 is a graph 800 showing voltage levels applied to the terminals of memory system 300 to read the contents of memory cells 305[0,0] and 305[0,1].

FIG. 8 is a graph 800 showing voltage levels applied to the terminals of memory system 300 to read the contents of memory cells 305[0,0] and 305[0,1]. Graph 800 is similar to graphs 400 and 600 of FIGS. 4 and 6, respectively, having the same y-axis labels.

To read row zero (memory cells 305[0,0] and 305[0,1]), read bitlines rBL0 and rBL1 are first precharged to supply voltage VDD and then left floating. Next, ground potential GND is applied to terminal VGND and supply voltage VDD is applied to control-gate line cgL0. The remaining control-gate lines, cgL1 in this example, are held at ground; potential. The voltage levels on read bitlines rBL0 and rBL1 are then sensed over a read time TR. If a memory cell is non-conductive, the associated read bitline will remain at the precharged voltage level indicative of a logic one. If a memory cell is conductive, the associated read bitline will be pulled toward ground, a voltage level representative of a logic zero. Sense amplifiers (not shown) connected to each bitline sense and amplify the bitline voltages. The next row, if any, can then be selected and read.

Figure 9:
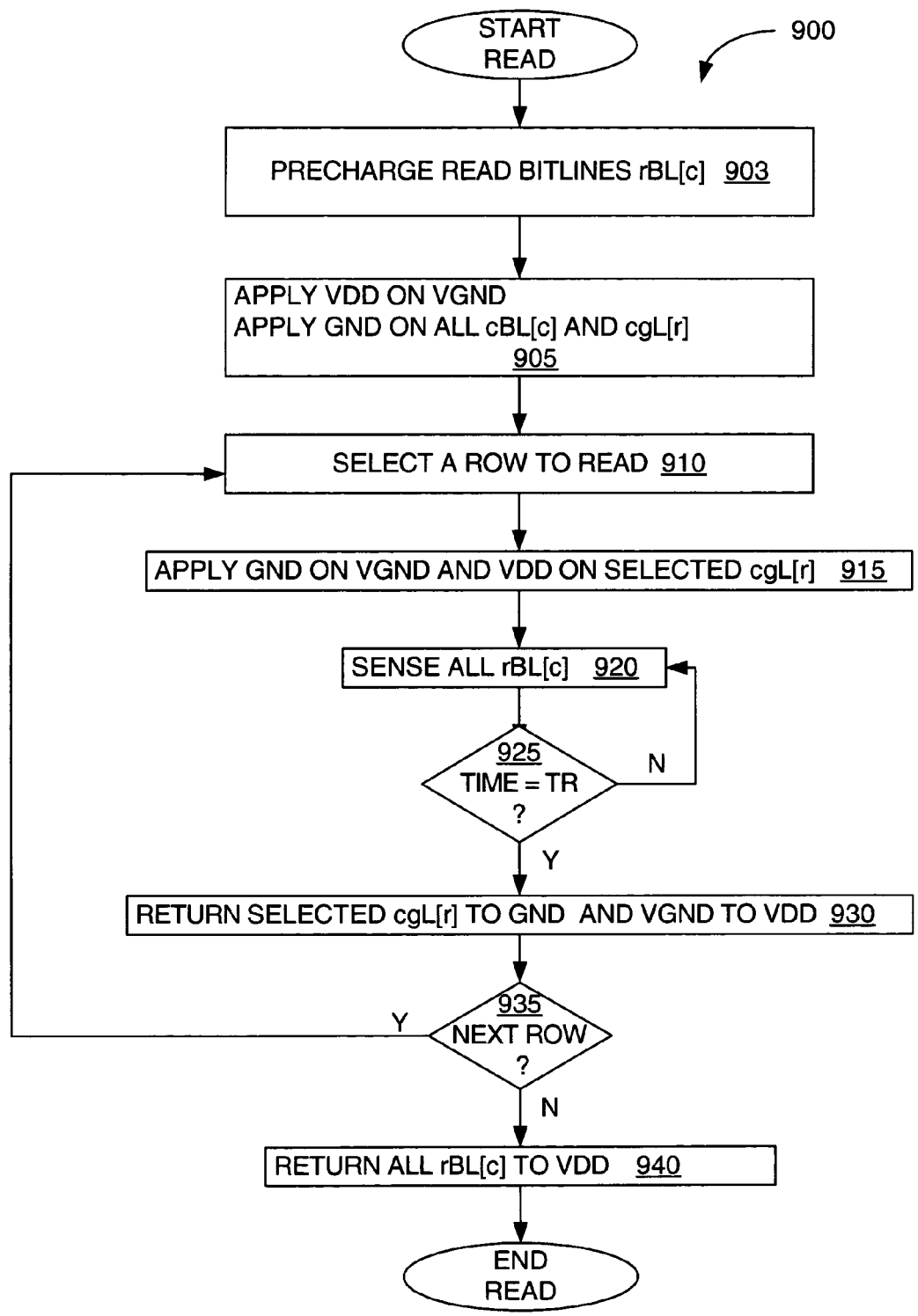
FIG. 9 is a read flow chart showing a method of reading memory system of FIG. 3.

FIG. 9 is a read flow chart 900 showing a method of reading memory system 300 of FIG. 3. Memory cells 305 are assumed to be configured (erased or programmed) before a read operation. Starting at step 903, all read bitlines rBL[c] are precharged to supply voltage VDD, a voltage level representative of a logic one, and left floating. Next, at step 905, all configuration bitlines cBL[c] are connected to ground potential GND. A first read signal applies ground potential to each of control-gate lines cgL[r], while a second read signal applies supply-voltage VDD to virtual ground terminal VGND. At step 910, the first row of memory cells 305[0,0] and 305[0,1] is selected for reading, after which ground potential is applied globally to terminal VGND and the selected row zero is activated by applying supply voltage VDD to control-gate line cgL0 while leaving control-gate line cgL1 at ground potential (step 915). Sense amplifiers connected to each read bitline rBL0 and rBL1 then sense the voltage presented on respective read bitlines rBL0 and rBL1 (step 920): programmed memory cells are conductive, and consequently pull the associated read bitline down from the precharge voltage toward ground potential.

Once sufficient time has passed to accomplish a read (decision 925), the selected control-gate line cgL[r] is returned to ground potential and terminal VGND to supply voltage VDD, thus de-selecting the recently read row (step 930). Steps 910 through 930 are then repeated for the next row. Once there are no additional rows to be read, all the read bitlines rBL[c] are returned to supply voltage VDD (step 940).

When reading an erased cell in a column that includes many programmed cells, the programmed cells may conduct just enough to collectively trip the sense amplifier connected to the associated bitline. This condition may lead to an erroneous detection of a programmed state when reading an erased memory cell. To combat such errors, the virtual ground VGND can be altered to further inhibit conduction of unselected programmed cells during read operations. A virtual-ground correction factor can be derived empirically or automatically from the leakage current through e.g. a column of programmed reference cells.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A memory system comprising:
 a read bitline;
 a plurality of memory cells, each of the plurality of memory cells having conductive and non-conductive states, each memory cell including:
  a programming dielectric having first and second dielectric terminals;
  a memory transistor having a first current-carrying terminal directly connected to the read bitline, a second current-carrying terminal, and a control terminal connected to the first dielectric terminal; and
  a capacitor having a first capacitor terminal, connected to the control terminal of the memory transistor, and a second capacitor terminal; and
 wherein the memory cells are arranged in a column of memory cells, the memory system further including a configuration bitline interconnecting the second dielectric terminals.

2. The memory system of claim 1, wherein the second current-carrying terminals of the memory transistors are interconnected.

3. The memory system of claim 2, wherein the second current-carrying terminals of the memory cells receive a reference voltage level.

4. The memory system of claim 3, wherein a read signal on the second capacitor terminal of a selected one of the memory cells in the conductive state renders the memory transistor conductive, the memory transistor providing a low impedance between the respective second current-carrying terminal and the read bitline.

5. The memory system of claim 3, wherein a read signal on the second capacitor terminal of a selected one of the memory cells in the non-conductive state renders the memory transistor non-conductive, the memory transistor providing a high impedance between the respective second current-carrying terminal and the read bitline.

6. The memory system of claim 3, wherein the reference voltage level is representative of a logic one.

7. The memory system of claim 1, further comprising a configuration bitline connected directly to first dielectric terminal of each memory cell.

8. A programmable logic device having the memory system of claim 1.

9. A method of configuring a first of a plurality of memory cells in a memory column, the memory column including a configuration bitline connected to each of the memory cells, a read bitline connected to each of the memory cells, and a plurality of control-gate lines, one of the control lines for each of the memory cells, the method comprising:
- applying a first programming voltage to the configuration bitline;
- applying a second programming voltage to the control-gate line connected to the first of the plurality of memory cells; and
- applying a program-inhibit voltage to the control-gate line of a second of the plurality of memory cells.

10. The method of claim 9, wherein the program-inhibit voltage is between the first and second programming voltages.

11. The method of claim 9, wherein the program-inhibit voltage approximately one half of the first programming voltage.

12. The method of claim 9, wherein each memory cell further includes:
- a memory transistor having a first current-carrying terminal connected to the read bitline, a second current-carrying terminal, and a control terminal;
- a program dielectric connected between the control terminal of the memory transistor and the configuration bitline; and
- a capacitor connected between the control gate of the transistor and the respective control-gate line.

13. The method of claim 12, wherein the first current-carrying terminal of the memory transistor is connected directly to the read bitline.

14. The method of claim 12, wherein program dielectric includes a first program-dielectric terminal connected directly to the configuration bitline and a second program-dielectric terminal connected directly to the control gate.

15. The method of claim 9, further comprising configuring a second of the plurality of memory cells in the memory column, wherein configuring the second memory cell includes:
- applying the first programming voltage to the configuration bitline;
- applying the second programming voltage to the control-gate line connected to the second memory cell; and
- applying the program-inhibit voltage to the control-gate line of a first memory cell.

16. The method of claim 9, further comprising reading the first memory cell, wherein reading the first memory cell includes:
- applying a first control-gate voltage to the control-gate line connected to the first memory cell;
- applying a second control-gate voltage to the control-gate line connected to the second memory cell; and
- monitoring the voltage level on the read bitline.

17. The method of claim 16, wherein the first control-gate voltage is a power-supply voltage.

* * * * *